(12) United States Patent
Kwon et al.

(10) Patent No.: US 10,421,883 B2
(45) Date of Patent: Sep. 24, 2019

(54) ABRASIVE PARTICLE-DISPERSION LAYER COMPOSITE AND POLISHING SLURRY COMPOSITION INCLUDING THE SAME

(71) Applicant: KCTECH CO., LTD., Anseong-si (KR)

(72) Inventors: Jang Kuk Kwon, Anseong-si (KR); Sung Pyo Lee, Anseong-si (KR); Chang Gil Kwon, Namyangju-si (KR); Jun Ha Hwang, Pyeongtaek-si (KR)

(73) Assignee: KCTECH CO., LTD., Anseong-si (KR)

( * ) Notice: Subject to any disclaimer, the term of this patent is extended or adjusted under 35 U.S.C. 154(b) by 0 days.

(21) Appl. No.: 15/386,502

(22) Filed: Dec. 21, 2016

(65) Prior Publication Data

US 2017/0183539 A1     Jun. 29, 2017

(30) Foreign Application Priority Data

Dec. 24, 2015    (KR) .................. 10-2015-0186156

(51) Int. Cl.

| | |
|---|---|
| *C09G 1/02* | (2006.01) |
| *C09G 1/04* | (2006.01) |
| *C09K 3/14* | (2006.01) |
| *H01L 21/304* | (2006.01) |
| *H01L 21/3105* | (2006.01) |
| *H01L 21/321* | (2006.01) |

(52) U.S. Cl.
CPC .............. *C09G 1/02* (2013.01); *C09G 1/04* (2013.01); *C09K 3/14* (2013.01); *C09K 3/1409* (2013.01); *C09K 3/1436* (2013.01); *C09K 3/1463* (2013.01); *C09K 3/1472* (2013.01); *H01L 21/304* (2013.01); *H01L 21/31053* (2013.01); *H01L 21/3212* (2013.01)

(58) Field of Classification Search
None
See application file for complete search history.

(56) References Cited

U.S. PATENT DOCUMENTS

| | | | | |
|---|---|---|---|---|
| 6,866,793 | B2 * | 3/2005 | Singh ................. | C09G 1/02 |
| | | | | 252/79.1 |
| 7,044,836 | B2 * | 5/2006 | Sun .................... | C09G 1/02 |
| | | | | 257/E21.304 |
| 2003/0060135 | A1 | 3/2003 | Moeggenborg et al. | |
| 2006/0099814 | A1 * | 5/2006 | Carter ................. | C09G 1/02 |
| | | | | 438/692 |

FOREIGN PATENT DOCUMENTS

| | | |
|---|---|---|
| CN | 101065458 A | 10/2007 |
| CN | 101065458 B | 10/2007 |
| CN | 101831243 A | 9/2010 |
| CN | 102017091 A | 4/2011 |
| CN | 103492519 A | 1/2014 |
| CN | 103492519 B | 1/2014 |
| TW | 201211223 A1 | 3/2012 |

* cited by examiner

*Primary Examiner* — Stephanie P Duclair
(74) *Attorney, Agent, or Firm* — Oblon, McClelland, Maier & Neustadt, L.L.P.

(57) ABSTRACT

An abrasive particle-dispersion layer composite and a polishing slurry composition including the abrasive particle-dispersion layer composite are provided. The abrasive particle-dispersion layer composite includes abrasive particles, a first dispersant that is at least one cationic compound among an amino acid, an organic acid, polyalkylene glycol and a high-molecular polysaccharide coupled to a glucosamine compound, and a second dispersant that is a cationic polymer including at least two ionized cations in a molecular formula.

14 Claims, No Drawings

ABRASIVE PARTICLE-DISPERSION LAYER COMPOSITE AND POLISHING SLURRY COMPOSITION INCLUDING THE SAME

CROSS-REFERENCE TO RELATED APPLICATIONS

This application claims the benefit of Korean Patent Application No. 10-2015-0186156 filed on Dec. 24, 2015, in the Korean Intellectual Property Office, the disclosure of which is incorporated herein by reference.

BACKGROUND

1. Field of the Invention

Embodiments relate to an abrasive particle-dispersion layer composite and a polishing slurry composition including the abrasive particle-dispersion layer composite.

2. Description of the Related Art

With diversification and high integration of semiconductor devices, technologies of forming finer patterns are used, and accordingly surface structures of semiconductor devices become more complicated and a step between surface films becomes greater. In manufacturing of semiconductor devices, chemical mechanical polishing (CMP) is used as a planarization technology to remove a stepped portion of a specific film formed on a wafer. The CMP is, for example, a process for removing an insulating film excessively formed for layer insulation, and is widely used to planarize an interlayer dielectric (ILD) and an insulating film for shallow trench isolation (STI) to insulate chips from each other, and used to form a metal conductive film, for example, a wiring, a contact plug or a via contact. The CMP is a widespread planarization technology to planarize a wafer that is in contact with a polishing pad by supplying a slurry to a contact area between the wafer and the polishing pad, and by mechanically removing an uneven surface of the wafer while relatively moving the wafer and the polishing pad through a chemical reaction. In the CMP, a polishing speed, a planarization degree of a polished surface and incidence of scratches are important, which are determined based on, for example, CMP conditions, types of slurries or types of polishing pads. As a degree of integration increases and a standard of a process becomes stricter, an insulating film with an excessively high step may need to be quickly planarized. Thus, there is a desire for development of abrasives having an automatic polishing stop function, because a step is removed at a high rate during initial polishing and a polishing speed is considerably reduced after the step is removed. In a single-layered slurry generated by mixing an anionic polymer and an anionic copolymer, a high polishing rate and a high selectivity may be realized in a high stepped portion, however, it is difficult to adjust a planarization degree and control dishing in a low stepped portion. Also, scratches are highly likely to occur due to an inherent hardness of abrasive particles.

SUMMARY

The present disclosure is to solve the foregoing problems, and an aspect of the present disclosure is to provide an abrasive particle-dispersion layer composite that may have a high selectivity and a high removal rate of a high stepped portion in a target film to be polished during initial polishing, that may implement an automatic polishing stop function by considerably reducing a polishing speed after a step is removed, and that may prevent occurrence of dishing and scratches, and to provide a polishing slurry composition including the abrasive particle-dispersion layer composite.

However, the problems to be solved in the present disclosure are not limited to the foregoing problems, and other problems not mentioned herein would be clearly understood by one of ordinary skill in the art from the following description.

According to an aspect, there is provided an abrasive particle-dispersion layer composite including abrasive particles, a first dispersant that is at least one cationic compound among an amino acid, an organic acid, polyalkylene glycol and a high-molecular polysaccharide coupled to a glucosamine compound, and a second dispersant that is a cationic polymer including at least two ionized cations in a molecular formula.

The abrasive particles may be chemically bonded to the first dispersant, and the first dispersant may be chemically bonded to the second dispersant.

A surface of the abrasive particles, the first dispersant and the second dispersant may have positive charges.

The cationic polymer may include at least two nitrogen atoms activated as cations.

The first dispersant may be present in an amount of 0.1% by weight (wt %) to 10 wt % in the abrasive particle-dispersion layer composite, and the second dispersant may be present in an amount of 0.01 wt % to 5 wt % in the abrasive particle-dispersion layer composite.

The abrasive particle-dispersion layer composite may further include at least one nonionic compound among polyethylene glycol, polypropylene glycol, a polyethylene-propylene copolymer, polyalkyl oxide, polyoxyethylene, polyethylene oxide, polypropylene oxide, polyvinylpyrrolidone, polyoxyalkylene alkyl ether, polyoxyalkylene alkyl ester, polyoxyethylene methyl ether, a polyethylene glycol sulfonic acid, polyvinyl alcohol, polyoxyethylene lauryl ether, polyoxyethylene cetyl ether, polyoxyethylene oleyl ether, polyoxyethylene sorbitan monolaurate and polyoxyethylene isooctylphenyl ether.

The nonionic compound may be present in an amount of 0.001 wt % to 1 wt % in the abrasive particle-dispersion layer composite.

The abrasive particles may include at least one of a metal oxide, a metal oxide coated with an organic material or inorganic material, and the metal oxide in a colloidal phase. The metal oxide may include at least one of silica, ceria, zirconia, alumina, titania, barium titania, germania, mangania and magnesia.

The abrasive particles may have a diameter of 10 nanometers (nm) to 300 nm.

The abrasive particles may be present in an amount of 0.1 wt % to 10 wt % in the abrasive particle-dispersion layer composite.

The abrasive particles may be prepared by a liquid-phase method and may be dispersed so that a surface of the abrasive particles may have positive charges.

According to another aspect, there is provided a polishing slurry composition including the abrasive particle-dispersion layer composite.

The polishing slurry composition may have pH ranging from 3 to 6.

The polishing slurry composition may have a zeta-potential of 10 millivolts (mV) to 60 mV.

A polishing selectivity of an oxide film:a nitride film or the oxide film:a poly film may range from 10:1 to 40:1 during polishing of a blanket wafer including the oxide film and either the nitride film or the poly film using the polishing slurry composition.

A polishing selectivity of an oxide film:a nitride film or the oxide film:a polysilicon film may range from 1:1 to 5:1 during polishing of a pattern wafer including the oxide film and either the nitride film or the polysilicon film using the polishing slurry composition.

Dishing of 200 angstroms (Å) or less may occurs, after a wafer that includes an oxide film and either a nitride film or a poly film and that has a line-and-space pattern with a line width of 100 micrometers (μm) and a pitch of 100 μm or less is polished using the polishing slurry composition. Dishing of 250 Å or less may occur, after a wafer that includes an oxide film and either a nitride film or a poly film and that has a line-and-space pattern with a line width of 300 μm and a pitch of 300 μm or greater is polished using the polishing slurry composition.

DETAILED DESCRIPTION

Hereinafter, embodiments of the present disclosure will be described in detail with reference to the accompanying drawings. When it is determined detailed description related to a related known function or configuration they may make the purpose of the present disclosure unnecessarily ambiguous in describing the present disclosure, the detailed description will be omitted here. Also, terms used herein are defined to appropriately describe the embodiments and thus may be changed depending on a user, the intent of an operator, or a custom of a field to which the present disclosure pertains. Accordingly, the terms must be defined based on the following overall description of this specification. Like reference numerals present in the drawings refer to the like elements throughout.

It will be understood throughout the whole specification that, unless specified otherwise, when one part "includes" or "comprises" one component, the part does not exclude other components but may further include the other components.

Hereinafter, an abrasive particle-dispersion layer composite and a polishing slurry composition including the abrasive particle-dispersion layer composite will be described in detail with reference to embodiments and drawings. However, the present disclosure is not limited to the embodiments and drawings.

According to an embodiment, an abrasive particle-dispersion layer composite may include abrasive particles, a first dispersant that is at least one cationic compound among an amino acid, an organic acid, polyalkylene glycol and a high-molecular polysaccharide coupled to a glucosamine compound, and a second dispersant that is a cationic polymer including at least two ionized cations in a molecular formula.

In the abrasive particle-dispersion layer composite, dispersants enclosing the abrasive particles may form a dispersion layer through a chemical bonding, and thus an amount of the dispersants adsorbed onto the abrasive particles may increase, hardness of the abrasive particles may be reduced, and lubricative properties, dispersibility and aggregation of particles may be enhanced.

In the abrasive particle-dispersion layer composite, the abrasive particles may be chemically bonded to the first dispersant, and the first dispersant may be chemically bonded to the second dispersant.

A surface of the abrasive particles, the first dispersant and the second dispersant may have the same charges. Thus, the first dispersant may be chemically bonded to the surface of the abrasive particles, and the second dispersant may be chemically bonded to a surface of the first dispersant.

In the abrasive particle-dispersion layer composite, the surface of the abrasive particles, the first dispersant and the second dispersant may have positive charges. Thus, the abrasive particles, the first dispersant and the second dispersant may not be bonded to each other by an electrostatic force and may not aggregate with each other.

The first dispersant may include, for example, at least one of an amino acid, an organic acid, polyalkylene glycol and a high-molecular polysaccharide coupled to a glucosamine compound, as a cationic compound.

The amino acid may enhance dispersibility of the abrasive particles, to further increase a polishing speed of an insulating film. The amino acid may include, for example, at least one of arginine, lysine, asparaginic acid, glutamic acid, asparagine, glutamine, histidine, proline, tyrosine, tryptophan, serine, threonine, glycine, alanine, β-alanine, methionine, cysteine, phenylalanine, leucine, valine and isoleucine.

The organic acid may include, for example, at least one of picolinic acid, nicotinic acid, isonicotinic acid, fusaric acid, dinicotinic acid, dipicolinic acid, lutidinic acid, quinolinic acid, glutamic acid, alanine, glycine, cystine, histidine, asparagine, guanidine, hydrazine, ethylenediamine, formic acid, acetic acid, benzoic acid, oxalic acid, succinic acid, malic acid, maleic acid, malonic acid, citric acid, lactic acid, tricarballyic acid, tartaric acid, aspartic acid, glutaric acid, adipic acid, suberic acid, fumaric acid, phthalic acid, pyridinecarboxylic acid and salts thereof.

The polyalkylene glycol may enhance polishing characteristics, for example, a polishing selectivity or a planarization degree. The polyalkylene glycol may include, for example, polyethylene glycol, polypropylene glycol and polybutylene glycol.

The high-molecular polysaccharide may include, for example, at least one of chitin, chitosan, chitooligosaccharide, mucopolysaccharide, proteoglycan, heparin, alginic acid, cellulose, hyaluronic acid, carrageenan, β-glucan and chondroitin sulfate.

The glucosamine compound included in the high-molecular polysaccharide may be glucosamine or a glucosamine derivative, and may include, for example, at least one of N-acetyl-D-glucosamine, N-methylglucosamine, N-acetyl-galactosamine, 2-acetamido-2-deoxy-β-D-glucose (N-acetyl glucosamine), poly(β-(1,4)-glucosamine), poly-N-succinyl-β-1-6-glucosamine (PNSG), poly-N-acetyl β-1-6-glucosamine (PNAG), N-acylglucosamine, glucosamine hydrochloride and glucosamine oligosaccharide.

The second dispersant may be a cationic polymer including at least two ionized cations in a molecular formula, and may desirably include at least two nitrogen atoms activated as cations. The cationic polymer may be a quaternary ammonium polymer.

The cationic polymer may include, for example, at least one of poly(diallyldimethyl ammonium chloride; poly[bis (2-chloroethyl) ether-alt-1,3-bis[3-(dimethylamino)propyl] urea]; ethanol, 2,2',2"-nitrilotris-, polymer with 1,4-dichloro-2-butene and N,N,N',N'-tetramethyl-2-butene-1,4-diamine; a hydroxyethyl cellulose dimethyl diallylammonium chloride copolymer; a copolymer of acrylamide and diallyldimethylammonium chloride; a copolymer of acrylamide and quaternized dimethylammoniumethyl methacrylate; a copolymer of acrylic acid and diallyldimethylammonium chloride; an acrylamide-dimethylaminoethyl methacrylate methyl chloride copolymer; quaternized hydroxyethyl cellulose; a copolymer of vinylpyrrolidone and quaternized dimethylaminoethyl methacrylate; a copolymer of vinylpyrrolidone and quaternized vinylimidazole; a copolymer of vinylpyrrolidone and methacrylamidopropyl trimethylammonium; poly(2-methacryloxyethyltrimethylammonium chloride); poly(acrylamide 2-methacryloxyethyltrimethyl ammonium chloride); poly[2-(dimethylamino)ethyl methacrylate) methyl chloride]; poly[(3-acrylamidopropyl) trimethylammonium chloride]; poly[(3-methacrylamidopropyl) trimethylammonium chloride]; poly[oxyethylene(dimethylimino)ethylene (dimethylimino)ethylene dichloride]; a terpolymer of acrylic acid, acrylamide and diallyldimethylammonium chloride; a terpolymer of acrylic acid, methacrylamidopropyl trimethylammonium chloride, and methyl acrylate, a terpolymer of vinylcaprolactam, vinylpyrrolidone, and quaternized vinylimidazole; poly(2-methacryloxyethyl phosphorylcholine-co-n-butyl methacrylate); poly[(dimethylamino)ethyl acrylate benzyl chloride quaternary salt (PDMAEA-BCQ); and poly[(dimethylamino)ethyl acrylate methyl chloride quaternary salt (PDMAEA-MCQ).

In the abrasive particle-dispersion layer composite, the first dispersant may be present in an amount of 0.1% by weight (wt %) to 10 wt %, and the second dispersant may be present in an amount of 0.01 wt % to 5 wt %. When the amount of the first dispersant is less than 0.1 wt % and the amount of the second dispersant is less than 0.01 wt %, the abrasive particles may be likely to aggregate with each other. When the amount of the first dispersant exceeds 10 wt % and the amount of the second dispersant exceeds 5 wt %, it may be difficult to form an abrasive particle-dispersion layer composite. Desirably, the first dispersant may be present in an amount of 1 wt % to 10 wt % and the second dispersant may be present in an amount of 0.1 wt % to 1 wt %, in the abrasive particle-dispersion layer composite.

The abrasive particle-dispersion layer composite may further include a third dispersant that is at least one anionic compound among a copolymer with a functional group of a resonance structure, a carboxyl group-containing polymer and a carboxyl group-containing organic acid.

The third dispersant may have negative charges as an anionic compound, and may include, for example, at least one of a copolymer with a functional group of a resonance structure, a carboxyl group-containing polymer and a carboxyl group-containing organic acid. The third dispersant may include, for example, at least one of polyacrylic acid, polysulfonic acid, a polyacrylic acid ammonium salt, polymethacrylic acid, a polymethacrylic acid ammonium salt, polyacrylic maleic acid, an acrylic/styrene copolymer, a polystyrene/acrylic acid copolymer, a polyacrylamide/acrylic acid copolymer, a polyacrylic acid/sulfonic acid copolymer, a polysulfonic acid/acrylamide copolymer and a polyacrylic acid/malonic acid copolymer.

The third dispersant may be present in an amount of 0.01 wt % to 5 wt % in the abrasive particle-dispersion layer composite. When the amount of the third dispersant is less than 0.01 wt %, the abrasive particles may be likely to aggregate with each other. When the amount of the third dispersant exceeds 5 wt %, it may be difficult to form an abrasive particle-dispersion layer composite.

The abrasive particle-dispersion layer composite may further include a nonionic compound to implement a poly film polishing stop function. The nonionic compound may include, for example, at least one of polyethylene glycol, polypropylene glycol, a polyethylene-propylene copolymer, polyalkyl oxide, polyoxyethylene, polyethylene oxide, polypropylene oxide, polyvinylpyrrolidone, polyoxyalkylene alkyl ether, polyoxyalkylene alkyl ester, polyoxyethylene methyl ether, a polyethylene glycol sulfonic acid, polyvinyl alcohol, polyoxyethylene lauryl ether, polyoxyethylene cetyl ether, polyoxyethylene oleyl ether, polyoxyethylene sorbitan monolaurate and polyoxyethylene isooctylphenyl ether. The nonionic compound may be present in an amount of 0.001 wt % to 1 wt % in the abrasive particle-dispersion layer composite. When the amount of the nonionic compound is less than 0.001 wt %, a poly film may be excessively polished because a polishing stop function for the poly film is not implemented. When the amount of the nonionic compound exceeds 1 wt %, a dispersion stability may decrease and microscratches may occur.

The abrasive particles may include at least one of a metal oxide, a metal oxide coated with an organic material or inorganic material, and the metal oxide in a colloidal phase. The metal oxide may include at least one of silica, ceria, zirconia, alumina, titania, barium titania, germania, mangania and magnesia.

The abrasive particles may have a diameter of 10 nanometers (nm) to 300 nm. When the diameter of the abrasive particles is less than 10 nm, a relatively small abrasive particle-dispersion layer composite may be formed, and accordingly a polishing rate may decrease. When the diameter of the abrasive particles exceeds 300 nm, a relatively large abrasive particle-dispersion layer composite may be formed, and accordingly it may be difficult to control dishing, a surface defect, the polishing rate and a selectivity.

The abrasive particles may be present in an amount of 0.1 wt % to 10 wt % in the abrasive particle-dispersion layer composite. When the amount of the abrasive particles is less than 0.1 wt %, a polishing speed may be reduced. When the amount of the abrasive particles exceeds 10 wt %, defects may be likely to occur due to the abrasive particles.

The abrasive particles may include, but are not limited to, abrasive particles prepared by a liquid-phase method. The liquid-phase method may include, for example, a sol-gel method of causing a chemical reaction of abrasive particle precursors in an aqueous solution and of growing crystals, to obtain minute particles, or a coprecipitation method of coprecipitating ions of abrasive particles in an aqueous solution, and a hydrothermal synthesis of forming abrasive particles under high-temperature and high-pressure conditions. The abrasive particles prepared by the liquid-phase method may be dispersed so that the surface of the abrasive particles may have positive charges.

The abrasive particles may be single crystalline particles, but are not limited thereto. When single crystalline abrasive particles are used, a scratch reduction effect may be achieved in comparison to polycrystalline abrasive particles, dishing may be prevented, and cleanability after polishing may be enhanced.

A shape of the abrasive particles may include, for example, at least one of a spherical shape, a square shape, a needle shape or a plate shape, and may desirably be the spherical shape.

The abrasive particle-dispersion layer composite may increase an amount of dispersants adsorbed onto the abrasive particles, may reduce hardness of the abrasive particles, and may enhance lubricative properties, dispersibility and aggregation of particles.

According to another embodiment, a polishing slurry composition may include the abrasive particle-dispersion layer composite.

The polishing slurry composition may be used to remove a high stepped portion by increasing a polishing speed and may have a high selectivity during polishing of an oxide film, and may implement an automatic polishing stop function for a nitride film or a poly film by reducing the polishing speed after a step is removed. Also, the polishing slurry composition may have an excellent effect of preventing dishing and scratches from occurring on a polished film.

The polishing slurry composition may further include a pH adjuster. The pH adjuster may include, for example, at least one of an inorganic acid or inorganic acid salt including at least one of nitric acid, hydrochloric acid, phosphoric acid, sulfuric acid, hydrofluoric acid, bromic acid, iodic acid and salts thereof; and an organic acid or organic acid salt including at least one of formic acid, malonic acid, maleic acid, oxalic acid, acetic acid, adipic acid, citric acid, propionic acid, fumaric acid, lactic acid, salicylic acid, pimelic acid, benzoic acid, succinic acid, phthalic acid, butyric acid, glutaric acid, glutamic acid, glycolic acid, asparaginic acid, tartaric acid and salts thereof.

The pH adjuster may be added to adjust pH of the polishing slurry composition. The pH of the polishing slurry composition may range from 3 to 6.

The polishing slurry composition may have a positive zeta-potential of 10 millivolts (mV) to 60 mV.

During polishing of a blanket wafer including an oxide film and either a nitride film or a poly film using the polishing slurry composition, a polishing selectivity of the oxide film:the nitride film or the oxide film:the poly film may range from 10:1 to 40:1, and an automatic polishing stop function for the nitride film or the poly film may be implemented.

During polishing of a pattern wafer including an oxide film and either a nitride film or a polysilicon film using the polishing slurry composition, a polishing stop film may be exposed on the pattern wafer. When the polishing stop film is exposed and when dishing is evaluated after overpolishing, the polishing selectivity of the oxide film:the nitride film or the oxide film:the polysilicon film may range from 1:1 to 5:1 and may desirably range from 1:1 to 3:1.

During polishing of a wafer including an oxide film and either a nitride film or a poly film using the polishing slurry composition, the oxide film may be polished at a high speed. The oxide film may have a polishing rate of 3,000 angstroms per minute (Å/min) or greater, and the nitride film or the poly film may have a polishing rate of 100 Å/min or less.

When pattern wafers are polished using the polishing slurry composition, a high polishing rate may be secured in a wafer with a high pattern density as well as a wafer with a low pattern density.

After a wafer that includes an oxide film and either a nitride film or a poly film and that has a line-and-space pattern with a line width of 100 micrometers (μm) and a pitch of 100 μm or less is polished using the polishing slurry composition, dishing of 200 Å or less may occur. After a wafer that includes an oxide film and either a nitride film or a poly film and that has a line-and-space pattern with a line width of 300 μm and a pitch of 300 μm or greater is polished using the polishing slurry composition, dishing of 250 Å or less and scratches of 50 ea or less may occur.

The abrasive particle-dispersion layer composite may have a high stability in the polishing slurry composition.

The polishing slurry composition may include the abrasive particle-dispersion layer, and thus may be excellent in a dispersion stability, may exhibit a high planarization degree, a high polishing speed and a high selectivity when a wafer including an oxide film and either a nitride film or a polysilicon film is polished, and may have an excellent effect of preventing dishing and scratches from occurring on a polished film.

Hereinafter, the present disclosure will be described in detail with reference to an example and a comparative example. However, the technical idea of the present disclosure is not limited or restricted thereto.

Example

In a solvent, 5 wt % of colloidal cerium oxide abrasive particles with an average size of 100 nm was inserted, and 4 wt % of picolinic acid as a first dispersant and 0.3 wt % of poly[bis(2-chloroethyl) ether-alt-1,3-bis[3-(dimethylamino)propyl]urea] as a second dispersant were mixed, thereby preparing an abrasive particle-dispersion layer composite. Nitric acid was added to a slurry composition including the prepared abrasive particle-dispersion layer composite, thereby preparing a polishing slurry composition with pH 5.

Comparative Example

A polishing slurry composition was prepared in the same manner as in the example except that only a first dispersant was added.

Silicon pattern wafers were polished using the polishing slurry compositions according to the example and the comparative example under the following polishing conditions.

[Polishing Conditions]
1. Polishing machine: AP-300 (manufactured by CTS)
2. Pad: K7 (manufactured by Rohm & Haas)
3. Polishing time: 60 sec
4. Table RPM: 87
5. Spindle RPM: 93
6. Flow rate: 300 ml/min
7. Used wafers: Pattern wafer having a line-and-space pattern with a line width of 100 μm and a pitch of 100 μm (NIT (nitride film) 1,000 Å, HDP (oxide film) 2,000 Å on Si), and pattern wafer having a line-and-space pattern with a line width of 300 μm and a pitch of 300 μm (NIT (nitride film) 1,000 Å, HDP (oxide film) 2,000 Å on Si)

After an initial operation of removing a step, a step of a silicon oxide film was adjusted to have a thickness of 1,200 Å to 1,400 Å, and a step of a silicon nitride film was adjusted to have a thickness of 1,000 Å based on information of a pattern wafer, and then overpolishing was additionally performed for 40 seconds, thereby determining a degree of dishing.

Table 1 shows polishing rates and dishing results obtained after polishing of pattern wafers using the polishing slurry compositions according to the example and the comparative example.

TABLE 1

| Item | First dispersant | Second dispersant | Pressure (psi) | Overpolishing (Removal of Oxide of 2,000 Å) | Polishing rate (Å/min) | Dishing (Å) Patten density (100 μm/100 μm) | Dishing (Å) Patten density (300 μm/300 μm) |
|---|---|---|---|---|---|---|---|
| Example | o | o | 4 | 50% | 3210 | 185 | 212 |
| Comparative example | o | x | 4 | 50% | 3810 | 450 | 643 |

Referring to Table 1, it is found that a dishing result exceeds 400 Å in the case of both a pattern density of 100 μm/100 μm and a pattern density of 300 μm/300 μm, despite a relatively high polishing rate, when the polishing slurry composition including only the first dispersant according to the comparative example is used. The polishing slurry composition including both the first dispersant and the second dispersant according to the example is excellent in a dishing performance while securing a relatively high polishing rate. Also, the polishing slurry composition according to the example shows an excellent dishing result in both a narrow portion with the pattern density of 100 μm/100 μm and a wide portion with the pattern density of 300 μm/300 μm. Thus, an excellent dishing prevention effect is observed when the polishing slurry composition according to the example is used, in comparison to when the polishing slurry composition according to the comparative example is used.

According to embodiments, an abrasive particle-dispersion layer composite may be formed through a chemical bonding of dispersants enclosing abrasive particles, and thus it is possible to increase an amount of dispersants adsorbed onto the abrasive particles, to reduce hardness of the abrasive particles and to enhance lubricative properties, dispersibility and aggregation of particles.

Also, according to embodiments, a polishing slurry composition may include an abrasive particle-dispersion layer composite, to remove a high stepped portion by increasing a polishing speed and to have a high selectivity when an oxide film and either a nitride film or a poly film are polished. The polishing slurry composition may implement an automatic polishing stop function for the poly film by considerably reducing the polishing speed after a step is removed, and may have an excellent effect of preventing dishing and scratches.

Although a few embodiments of the present disclosure have been shown and described, the present disclosure is not limited to the described embodiments. Instead, it would be appreciated by those skilled in the art that changes may be made to these embodiments without departing from the principles and spirit of the present disclosure, the scope of which is defined by the claims and their equivalents.

What is claimed is:

1. An abrasive particle-dispersion layer composite comprising:
    abrasive particles;
    a first dispersant being at least one cationic compound selected from the group consisting of an amino acid, an organic acid, polyalkylene glycol and a high-molecular polysaccharide coupled to a glucosamine compound; and
    a second dispersant being a cationic polymer comprising at least two ionized cations in a molecular formula; and
    a third dispersant being at least one anionic compound selected from the group consisting of at least one of a copolymer with a functional group of a resonance structure, a carboxyl group-containing polymer and a carboxyl group-containing organic acid;
    wherein the cationic polymer comprises at least two nitrogen atoms activated as cations,
    wherein the first dispersant is present in an amount of 0.1% by weight (wt %) to 10 wt % in the abrasive particle-dispersion layer composite,
    wherein the second dispersant is present in an amount of 0.01 wt % to 5 wt % in the abrasive particle-dispersion layer composite,
    wherein the third dispersant may be present in an amount of 0.01 wt % to 5 wt % in the abrasive particle-dispersion layer composite,
    wherein dishing of 200 angstroms (Å) or less occurs, after a wafer that includes an oxide film and either a nitride film or a poly film and that has a line-and-space pattern with a line width of 100 micrometers (μm) and a pitch of 100 μm or less is polished using the abrasive particle-dispersion layer composite, and
    wherein dishing of 250 Å or less occurs, after a wafer that includes an oxide film and either a nitride film or a poly film and that has a line-and-space pattern with a line width of 300 μm and a pitch of 300 μm or greater is polished using the abrasive particle-dispersion layer composite.

2. The abrasive particle-dispersion layer composite of claim 1, wherein the abrasive particles are chemically bonded to the first dispersant, and the first dispersant is chemically bonded to the second dispersant.

3. The abrasive particle-dispersion layer composite of claim 1, wherein a surface of the abrasive particles, the first dispersant and the second dispersant have positive charges.

4. The abrasive particle-dispersion layer composite of claim 1, further comprising:
    at least one nonionic compound selected from the group consisting of polyethylene glycol, polypropylene glycol, a polyethylene-propylene copolymer, polyalkyl oxide, polyoxyethylene, polyethylene oxide, polypropylene oxide, polyvinylpyrrolidone, polyoxyalkylene alkyl ether, polyoxyalkylene alkyl ester, polyoxyethylene methyl ether, a polyethylene glycol sulfonic acid, polyvinyl alcohol, polyoxyethylene lauryl ether, polyoxyethylene cetyl ether, polyoxyethylene oleyl ether, polyoxyethylene sorbitan monolaurate and polyoxyethylene isooctylphenyl ether.

5. The abrasive particle-dispersion layer composite of claim 4, wherein the nonionic compound is present in an amount of 0.001 wt % to 1 wt % in the abrasive particle-dispersion layer composite.

6. The abrasive particle-dispersion layer composite of claim 1, wherein the abrasive particles comprise at least one selected from the group consisting of a metal oxide, a metal oxide coated with an organic material or inorganic material, and the metal oxide in a colloidal phase, and
    wherein the metal oxide comprises at least one selected from the group consisting of silica, ceria, zirconia, alumina, titania, barium titania, germania, mangania and magnesia.

7. The abrasive particle-dispersion layer composite of claim 1, wherein the abrasive particles have a diameter of 10 nanometers (nm) to 300 nm.

8. The abrasive particle-dispersion layer composite of claim 1, wherein the abrasive particles are present in an amount of 0.1 wt % to 10 wt % in the abrasive particle-dispersion layer composite.

9. The abrasive particle-dispersion layer composite of claim 1, wherein the abrasive particles are prepared by a liquid-phase method and are dispersed so that a surface of the abrasive particles has positive charges.

10. A polishing slurry composition comprising the abrasive particle-dispersion layer composite of claim 1.

11. The polishing slurry composition of claim 10, wherein the polishing slurry composition has pH ranging from 3 to 6.

12. The polishing slurry composition of claim 10, wherein the polishing slurry composition has a zeta-potential of 10 millivolts (mV) to 60 mV.

13. The polishing slurry composition of claim 10, wherein a polishing selectivity of an oxide film:a nitride film or the oxide film:a poly film ranges from 10:1 to 40:1 during polishing of a blanket wafer including the oxide film and either the nitride film or the poly film using the polishing slurry composition.

14. The polishing slurry composition of claim 10, wherein a polishing selectivity of an oxide film:a nitride film or the oxide film:a polysilicon film ranges from 1:1 to 5:1 during polishing of a pattern wafer including the oxide film and either the nitride film or the polysilicon film using the polishing slurry composition.

* * * * *